(12) United States Patent
Swiss et al.

(10) Patent No.: US 6,476,478 B1
(45) Date of Patent: Nov. 5, 2002

(54) CAVITY SEMICONDUCTOR PACKAGE WITH EXPOSED LEADS AND DIE PAD

(75) Inventors: Gary L. Swiss, Gilbert, AZ (US); Angel O. Alvarez, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/439,917

(22) Filed: Nov. 12, 1999

(51) Int. Cl.⁷ .......................... H01L 23/48; H01L 23/52
(52) U.S. Cl. .................. 257/692; 257/690; 257/676
(58) Field of Search .................. 257/680, 692, 257/667, 676, 674

(56) References Cited

U.S. PATENT DOCUMENTS

| | | | |
|---|---|---|---|
| 3,838,984 A | 10/1974 | Crane et al. | 29/193.5 |
| 4,530,152 A | 7/1985 | Roche et al. | 29/588 |
| 4,737,839 A | * 4/1988 | Burt | 357/67 |
| 4,812,896 A | 3/1989 | Rothgery et al. | 357/70 |

(List continued on next page.)

FOREIGN PATENT DOCUMENTS

| | | |
|---|---|---|
| JP | 57-45959 | 3/1982 |
| JP | 58-160095 | 8/1983 |
| JP | 59-227143 | 12/1984 |
| JP | 62-9639 | 7/1985 |
| JP | 61-39555 | 2/1986 |
| JP | 63-205935 | 8/1988 |
| JP | 63-233555 | 9/1988 |
| JP | 64-54749 | 3/1989 |
| JP | 3-108745 | * 5/1991 ................. 257/788 |
| JP | 7-312405 | 11/1995 |
| JP | 8-125066 | 5/1996 |
| JP | 8-306853 | 11/1996 |
| JP | 9-8205 | 1/1997 |
| JP | 9-8206 | 1/1997 |
| JP | 9-8207 | 1/1997 |
| JP | 9-92775 | 4/1997 |
| KR | 94-1979 | 1/1994 |
| KR | 96-9774 | 4/1996 |

*Primary Examiner*—Stephen D. Meier
*Assistant Examiner*—Pamela Perkins
(74) *Attorney, Agent, or Firm*—Stetina Brunda Garred & Brucker

(57) ABSTRACT

A semiconductor chip package and a method of making the package are disclosed. The method includes forming a lead frame having a die pad and leads. At least one of the leads has a tab projecting upward and laterally from a body of the lead. In one embodiment, curved tips are formed on the inner ends of the leads. At least a portion of the lead frame is encapsulated with a mold material to form a package mold having a cavity. The cavity has a floor with a thickness substantially similar to the thickness of the leads so as to expose upper surfaces of the inner ends of the leads. The leads have lower surfaces exposed at the lower surface of the package mold. The lead tab is entirely encapsulated within the package mold. A semiconductor die is mounted on the lead frame subsequent to the encapsulation of at least a portion of the lead frame. The semiconductor die is enclosed in the package mold by placing a covering such as a lid over the semiconductor die. This method yields a cavity semiconductor package which may be used in applications where contact between the package mold and the semiconductor die and/or bond wires is undesirable, while allowing the leads and die pad to be securely held in place by the package mold.

20 Claims, 3 Drawing Sheets

U.S. PATENT DOCUMENTS

| | | | |
|---|---|---|---|
| 5,041,902 A | 8/1991 | McShane | 357/79 |
| 5,157,480 A | 10/1992 | McShane et al. | 357/74 |
| 5,172,213 A | 12/1992 | Zimmerman | 257/796 |
| 5,172,214 A | 12/1992 | Castro | 257/676 |
| 5,200,362 A | 4/1993 | Lin et al. | 437/207 |
| 5,200,809 A | 4/1993 | Kwon | 257/707 |
| 5,214,845 A | 6/1993 | King et al. | 29/841 |
| 5,216,278 A | 6/1993 | Lin et al. | 257/688 |
| 5,221,642 A | 6/1993 | Burns | 437/207 |
| 5,258,094 A | 11/1993 | Furui et al. | 156/634 |
| 5,273,938 A | 12/1993 | Lin et al. | 437/207 |
| 5,277,972 A | 1/1994 | Sakumoto et al. | 428/355 |
| 5,278,446 A | 1/1994 | Nagaraj et al. | 257/707 |
| 5,279,029 A | 1/1994 | Burns | 29/856 |
| 5,332,864 A | 7/1994 | Liang et al. | 174/52.4 |
| 5,336,931 A | 8/1994 | Juskey et al. | 257/787 |
| 5,343,076 A | 8/1994 | Katayama et al. | 257/717 |
| 5,406,124 A | 4/1995 | Morita et al. | 257/783 |
| 5,424,576 A | 6/1995 | Djennas et al. | 257/666 |
| 5,435,057 A | 7/1995 | Bindra et al. | 29/830 |
| 5,474,958 A | 12/1995 | Djennas et al. | 437/211 |
| 5,508,556 A * | 4/1996 | Lin | 257/691 |
| 5,521,429 A | 5/1996 | Aono et al. | 257/676 |
| 5,604,376 A | 2/1997 | Hamburgen et al. | 257/676 |
| 5,608,267 A | 3/1997 | Makulikar et al. | 257/796 |
| 5,639,990 A | 6/1997 | Nishihara et al. | 174/52.2 |
| 5,640,047 A | 6/1997 | Nakashima | 257/738 |
| 5,641,997 A | 6/1997 | Ohta et al. | 257/788 |
| 5,644,169 A | 7/1997 | Chun | 257/787 |
| 5,646,831 A | 7/1997 | Manteghi | 361/813 |
| 5,650,663 A | 7/1997 | Parthasarathi | 257/706 |
| 5,683,806 A | 11/1997 | Sakumoto et al. | 428/343 |
| 5,696,666 A | 12/1997 | Miles et al. | 361/764 |
| 5,701,034 A | 12/1997 | Marrs | 257/706 |
| 5,710,064 A | 1/1998 | Song et al. | 437/220 |
| 5,776,798 A | 7/1998 | Quan et al. | 438/112 |
| 5,783,861 A | 7/1998 | Son | 253/693 |
| 5,835,988 A | 11/1998 | Ishii | 257/684 |
| 5,859,471 A | 1/1999 | Kuraishi et al. | 257/666 |
| 5,866,939 A | 2/1999 | Shin et al. | 257/666 |
| 5,877,043 A | 3/1999 | Alcoe et al. | 438/123 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/796 |
| 5,981,314 A | 11/1999 | Glenn et al. | 438/127 |
| 6,001,671 A | 12/1999 | Fjelstad | 438/112 |
| 6,130,473 A | 10/2000 | Mostafazadeh et al. | 257/666 |
| 6,143,981 A | 11/2000 | Glenn | 174/52.4 |
| 6,229,200 B1 | 5/2001 | McLellan et al. | 257/666 |
| 6,239,384 B1 * | 5/2001 | Smith et al. | 174/261 |

* cited by examiner

CAVITY SEMICONDUCTOR PACKAGE WITH EXPOSED LEADS AND DIE PAD

TECHNICAL FIELD OF THE INVENTION

The present invention relates to semiconductor chip packages, and in particular to a cavity semiconductor package with exposed leads and an exposed die pad, and a method for making the same.

BACKGROUND OF THE INVENTION

Semiconductor chip packages that have leads and a die pad exposed on the bottom surface are known. Some of the challenges of forming such packages, while ensuring that the leads and die pad remain locked to the package mold, are addressed in co-pending U.S. patent application, Ser. No. 09/395,875, entitled "Plastic Integrated Circuit Device Package and Micro-Leadframe and Method for Making the Package," and in co-pending U.S. patent application, Ser. No. 09/393,016, entitled "Plastic Integrated Circuit Package and Method and Leadframe for Making the Package," both of which are incorporated by reference herein in their entirety.

In these known semiconductor packages, the method of making the package includes molding an encapsulant around the semiconductor die, the die pad and the leads. While this method is suitable for some applications, in other applications such as packaging for power MOSFETs and GaAs chips, it is desirable to maintain a separation between, on the one hand, the package mold material, and on the other hand, the semiconductor die and bond wires. Forming such package with leads exposed on the bottom surface thereof presents special challenges, particularly in ensuring that the leads and die pad remain within the package mold.

SUMMARY OF THE INVENTION

Therefore, a need has arisen for a semiconductor chip package and packaging method that meets these challenges. In particular, a need has arisen for a cavity semiconductor package with exposed leads and die pad, where the lead and die pad remain locked to the package mold, and a method for making the same.

Accordingly, a method for assembling a semiconductor chip package is disclosed. In one embodiment, the method includes forming a lead frame with a die pad and leads. At least one of the leads has a tab projecting upward and laterally from a body of the lead. In one embodiment, curved tips are formed on the inner ends of the leads. At least a portion of the lead frame is encapsulated with a mold material to form a package mold having a cavity. The cavity has a floor with a thickness substantially similar to the thickness of the leads so as to expose upper surfaces of the inner ends of the leads. The leads have lower surfaces exposed at the lower surface of the package mold. In one embodiment, the lead tab is entirely encapsulated within the package mold. A semiconductor die is mounted on the lead frame subsequent to the encapsulation of at least a portion of the lead frame. The semiconductor die is enclosed in the package mold by placing a covering such as a lid over the semiconductor die.

In another aspect of the present invention, a semiconductor chip package is disclosed. In one embodiment, the semiconductor chip package includes a semiconductor die mounted on a die pad and a plurality of leads projecting inward toward the semiconductor die. At least one of the leads has a tab projecting upward and laterally from the body of the lead. The package also includes a package mold with a cavity that has a floor. The thickness of the floor is substantially similar to the thickness of the leads, so as to expose upper surfaces of the inner ends of the leads. The leads have lower surfaces exposed at the lower surface of the package mold. The lead tab is entirely encapsulated within the package mold. The package also includes a lid attached to the package mold covering the cavity.

An advantage of the present invention is that the above described packaging method yields a cavity semiconductor package which may be used in applications where contact between the package mold and the semiconductor die and/or bond wires is undesirable. Another advantage of the present invention is that the package and method allow the leads and die pad to be securely held in place by the package mold.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF EXEMPLARY EMBODIMENTS

The exemplary embodiments of the present invention and their advantages are best understood by referring to FIGS. 1A through 5 of the drawings. Like numerals are used for like and corresponding parts of the various drawings.

Figure 1A:
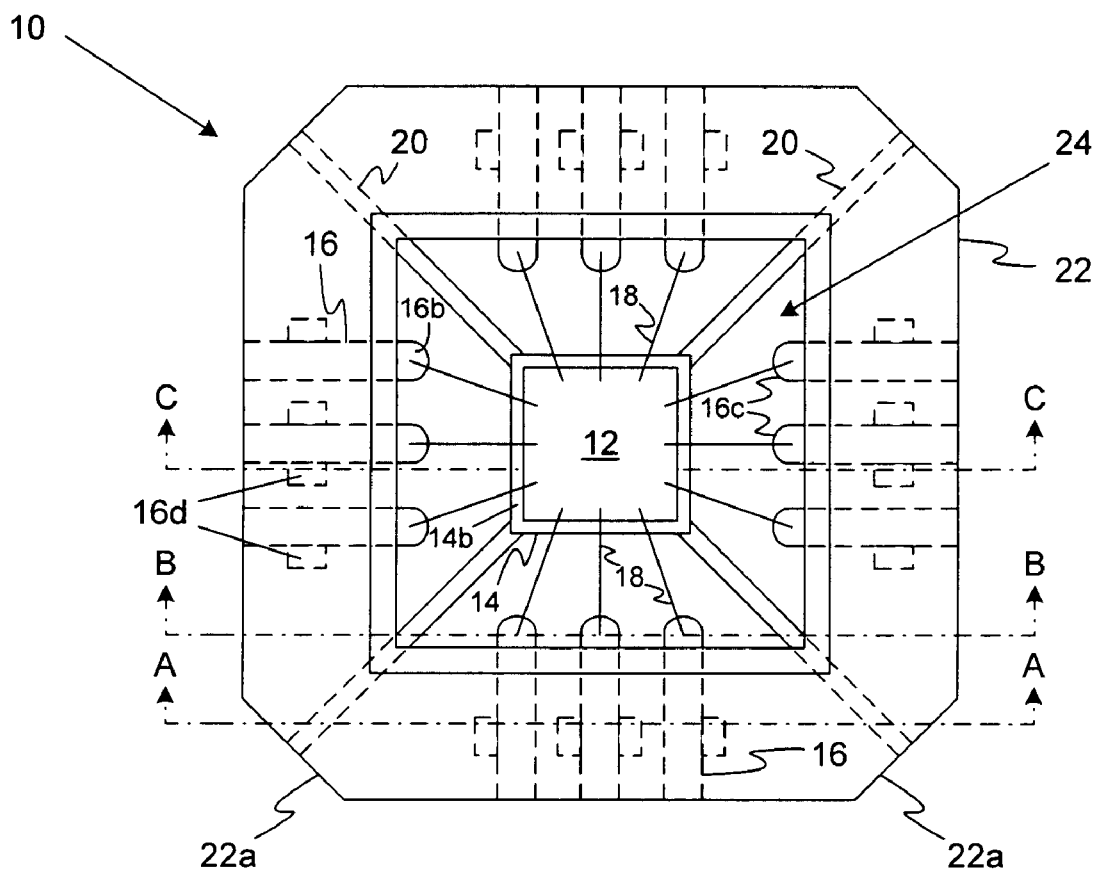
FIGS. 1A and 1B are top and side views, respectively, of a semiconductor chip package constructed in accordance with the present invention.
Figure 1B:
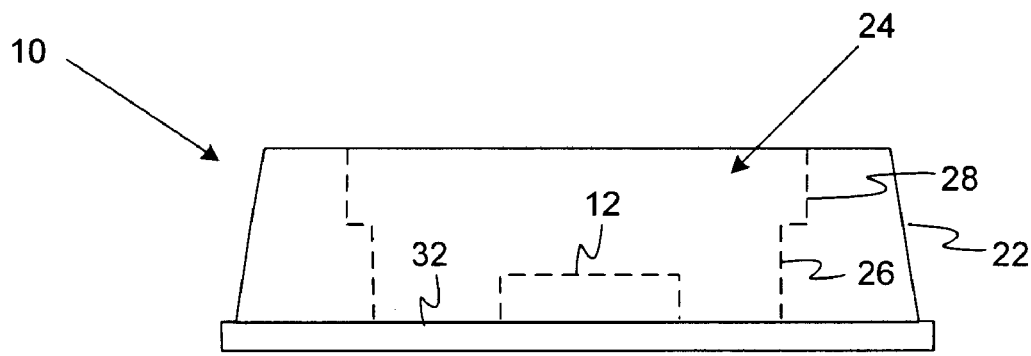
Figure 2:
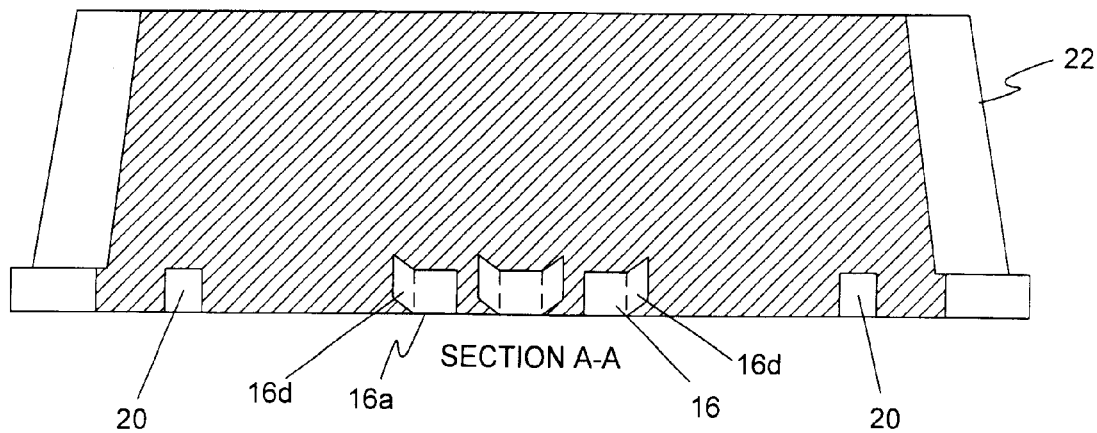
FIGS. 2, 3 and 4 are cross sections of the semiconductor chip package along the section lines indicated in FIG. 1A.
Figure 3:
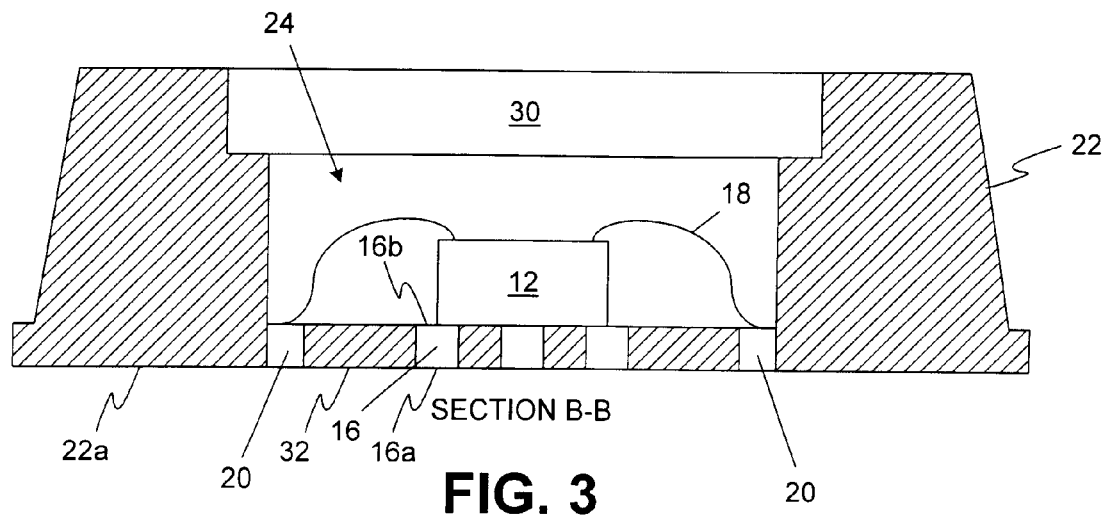
Figure 4:
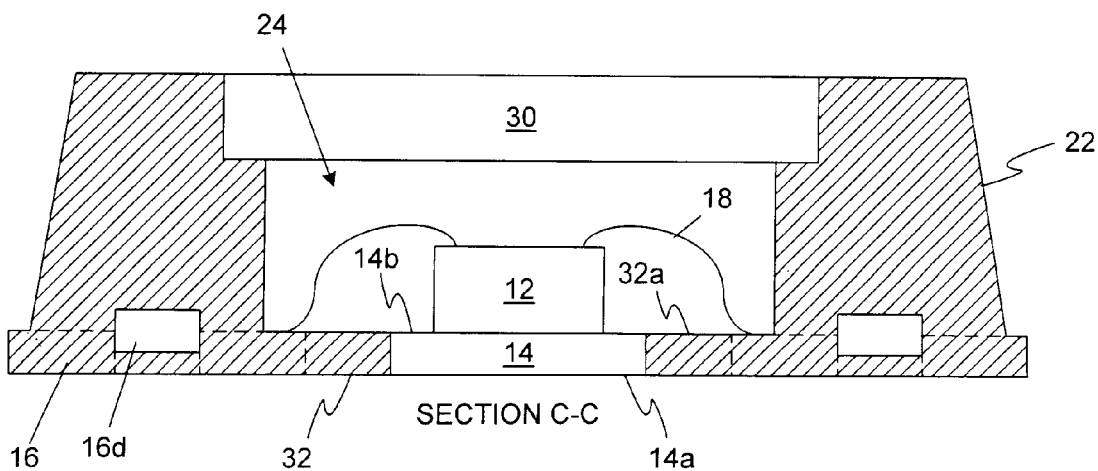

FIGS. 1A and 1B are top and side views, respectively, of a semiconductor chip package 10 constructed in accordance with the present invention. FIGS. 2, 3 and 4 are cross sections of package 10 along the section lines indicated in FIG. 1A. Reference may be made to these figures in conjunction with the following description to understand the various components of package 10.

Package 10 includes a semiconductor die 12 mounted on a die pad 14. A set of leads 16 projects inward from the outer perimeter of package 10 toward die 12 and die pad 14. Bond pads (not shown) on die 12 are electrically connected to respective ones of the leads 16 by bond wires 18. Diagonal support elements 20 support die pad 14 in position prior to the package molding and saw steps of the assembly process, as will be described more fully below.

A package mold 22 provides structural support for package 10. Package mold 22 may be formed from any one of a variety of commercially available mold compounds such as epoxidized ortho cresol novolac (EOCN), biphenyl (BP), dicyclopentadiene (DCPD) and multifunctional (MF) compounds available from a variety of manufacturers. Package mold 22 has a generally square outline as shown in FIG. 1A, with chamfered corners 22a. While chamfered corners 22a are not necessary to practice the present invention, they may help to reduce the mechanical stress caused by a thermal expansion mismatch between the lead frame material and the mold compound. Chamfered corners 22a may be formed by the shape of the mold used to form package mold 22. When packages such as package 10 are to be formed in large quantities, as described below, it may be more efficient to create square corners on package 10 rather than chamfered corners 22a.

Package mold 22 forms a cavity area 24 with a perimeter 26. An upper perimeter 28 forms a somewhat larger open area above cavity area 24. When package 10 is fully assembled, a lid 30 rests inside upper perimeter 28, above the cavity area 24 formed by lower perimeter 26. Cavity area 24 has a floor 32 formed by package mold 22, die pad 14 and the tips of leads 16.

Die pad 14 and leads 16 have bottom surfaces 14a and 16a, respectively, that are substantially coplanar (except as described hereinafter) with the bottom surface 22a of package mold 22. Thus, the bottom surfaces 14a and 16a of die pad 14 and leads 16, respectively, are exposed at the bottom surface 22a of package mold 22 so that electrical and/or thermal contact may be made with die pad 14 and leads 16. Similarly, die pad 14 and leads 16 have upper surfaces 14b and 16b, respectively, which are substantially coplanar (except as described hereinafter) with the upper surface 32a of floor 32. This allows electrical contact to be established to die 12 via bond wires 18 attached to the upper surface 16b of leads 16. Thus, die pad 14 and leads 16 have the same thickness as the floor 32 of cavity area 24.

Because leads 16 are exposed along the bottom surface 22a of package mold 22, leads 16 are susceptible to breaking free from the adhesion of package mold 22, which can result in one or more leads 16 projecting downward from the bottom surface 22a of package mold 22 or even breaking free from package 10 altogether, causing an intermittent open circuit. Leads 16 are vulnerable to loss of adhesion in the region of the floor 32 of cavity area 24, where leads 16 have both their upper surfaces 16b and their lower surfaces 16a exposed (i.e. not covered by package mold 22).

It is, of course, desirable to keep leads 16 in a planar arrangement and fixed to package mold 22. Thus, leads 16 have design features which are effective in preventing leads 16 from breaking free from package mold 22.

In particular, leads 16 have curved tips 16c at their interior ends adjacent to which bond wires 18 are attached. These curved tips 16c increase the degree of adhesion between tips 16c and package mold 22 due to greater surface area compared to square-ended leads. Thus, a greater shear force is required to break tips 16c away from floor 32 of package mold 22.

In addition, leads 16 have tabs 16d attached thereto, which function as anchors. Tabs 16d are angled upward from the bodies of leads 16. Thus, in the assembly process described below, package mold 22 is allowed to fill the area underneath tabs 16d as shown in FIG. 2, locking tabs 16d in place. Tabs 16d in turn hold leads 16 in place, preventing downward or outward movement of leads 16. In an alternative embodiment (not shown), tabs 16d are staggered on adjacent leads so that the leads may be closer together.

Other known mechanisms may also be used to lock leads 16 and die pad 14 in place. These known mechanisms include etching or coining portions of die pad 14 and leads 16, and are described in the aforementioned co-pending U.S. patent applications, Ser. Nos. 09/395,875 and 09/393,016, which have been incorporated herein by reference. Accordingly, these methods will not be described further herein.

Any one of the methods described herein for locking leads 16 and die pad 14 in place, including the use of tabs 16d, curved tips 16c and the etching or coining steps mentioned above, may be used alone or in combination with the other methods. However, curved tips 16c and tabs 16d may easily be accomplished in the lead frame stamping step, as described below, without requiring additional steps after the formation of the lead frame.

An exemplary set of dimensions for semiconductor chip package 10 are given in Table A. These dimensions are set forth for illustrative purposes only, and in no way represent a limitation on the usefulness of the techniques described herein. A die thickness of 0.004–0.027 inches is assumed.

TABLE A

| Height of package: | Lead/die pad thickness + die thickness + lid height + 0.006 in (e.g. 0.9 mm) |
|---|---|
| Width/length of package: | 7 mm |
| Angle of chamfered corners: | 45° |
| Length of package edge between chamfered corners: | 5.181 mm |
| Angle of inclination of package mold sides: | 82° |
| Number of leads: | 12 |
| Lead spacing (center-to-center): | 0.762 mm |
| Lead width: | 0.381 mm |
| Lead/die pad thickness: | 0.004–0.010 in. |
| Cavity floor thickness: | 0.004–0.010 in. |
| Length/width of upper perimeter/lid: | 4.519 mm × 4.519 mm |
| Length/width of lower perimeter: | 4.000 mm × 4.000 mm |
| Height of upper perimeter/lid: | 0.508 mm |
| Height of lower perimeter: | die thickness + 0.006 in. |
| Length/width of die pad: | 1.727 mm |

Figure 5:
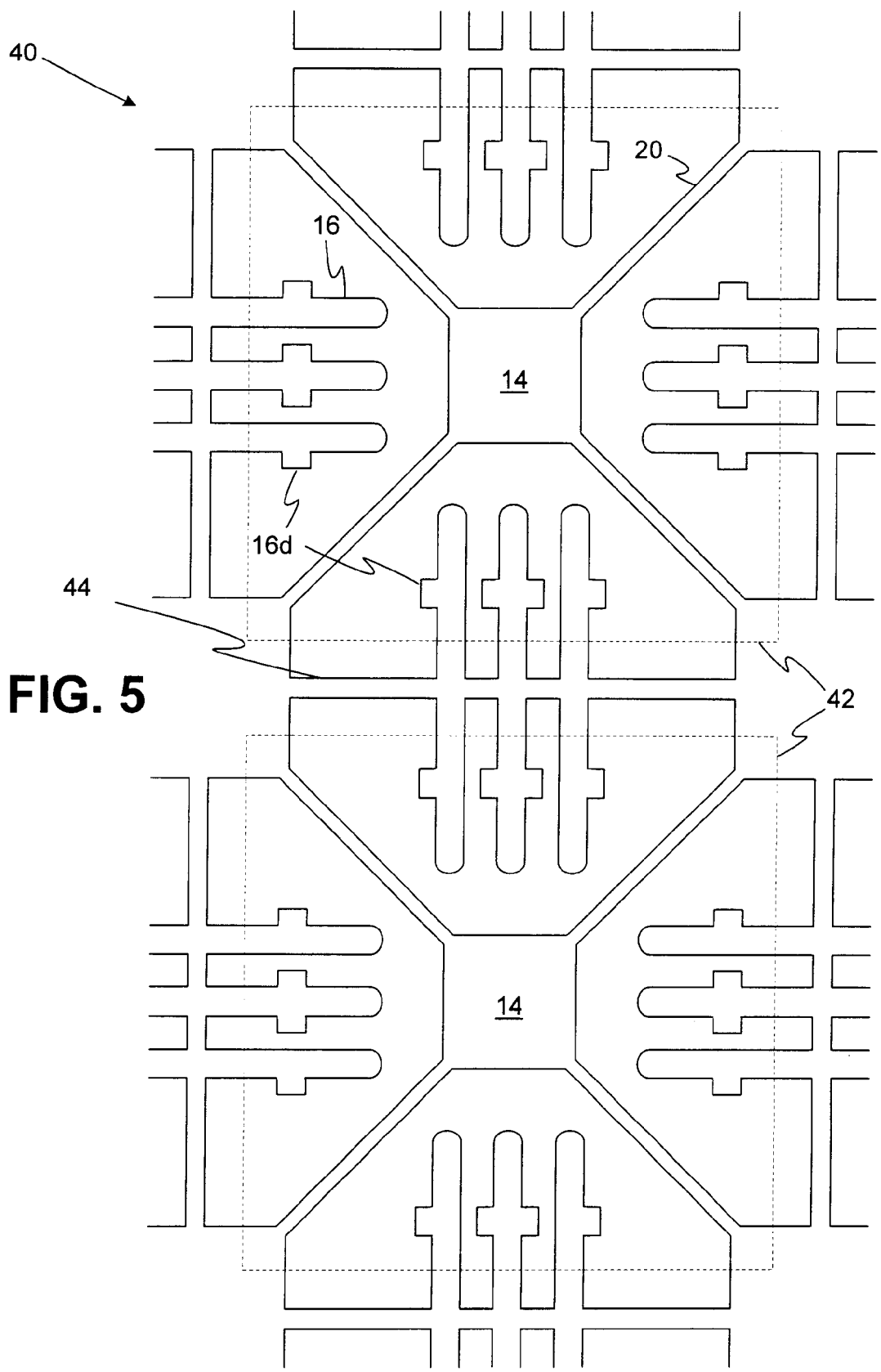
FIG. 5 is a top view of a portion of a lead frame for use in a package assembly process in accordance with the present invention.

An assembly process for creating packages such as package 10 in quantity will now be described. Referring to FIG. 5, a top view of a portion of a lead frame 40 for use in such an assembly process is shown, with the outline of the final shape of semiconductor chip packages 10 being overlaid in dashed lines 42 for reference. In the first step of the process, lead frame 40 is created. In one embodiment, lead frame 40 is stamped from a single, planar sheet of metal, such as the steel alloy known as "alloy 42," or copper, or copper alloys with or without nickel or palladium plating. While most of the components of lead frame 40 remain planar after this stamping process, tabs 16d may be formed into their upward-canted shape by the same progressive stamping process that creates lead frame 40.

After the formation of lead frame 40, any additional modifications such as etching or coining may be carried out, if desired. The package mold 22 for an entire array of packages is then formed by injection molding around lead frame 40. In one embodiment, the shape of the mold is such that cavity area 24 and the upper perimeter 28 for encompassing lid 30 are formed in package mold 22 during the molding process. Conventional molding compounds are used, as described above. Of course, lid 30 is not formed during this process, but is formed separately.

After the formation of package mold 22, semiconductor die 12 is attached to die pad 14 and wire bonds 18 are attached within cavity area 24 using conventional die attach and wire bond procedures. Die 12 may be any conventional type of die, and especially a die of a type requiring separation from the package mold and/or access through lid 30. For example, die 12 may be a power MOSFET, a GaAs chip, a surface acoustical wave device, an optical chip (e.g., a camera chip), or an erasable memory chip, among other possibilities.

The semiconductor chip packages 10, shown in outline by dashed lines 42, are then separated from each other by a sawing, punching, or equivalent cutting process. In one embodiment, the spacing between adjacent packages and the width of the saw blade are such that the region of lead frame material and mold compound between the dashed lines 42, such as connecting strip 44, is obliterated in a single pass of the saw blade. A suitable saw process is described in more detail in the aforementioned co-pending U.S. patent applications, Ser. Nos. 09/395,875 and 09/393,016, and will not be described further herein. In this embodiment, each package 10 has square corners as shown by dashed lines 42 rather than chamfered corners 22a as previously illustrated. While additional saw blade passes may be used to create chamfered corners, this may not prove economical for a mass production environment.

Lid 30 may be placed inside upper perimeter 28 either before or after the sawing or other cutting processes described above. Depending upon the application, lid 30 may be formed of glass, optically clear glass, metal, ceramic, plastic, optically clear plastic, or a compound similar to that used for package mold 22. Lid 30 may be attached to package mold 22 using any known adhesive suitable for the type of lid used.

In an alternative embodiment (not shown), a so-called "glop top" is implemented instead of lid 30. In this embodiment, a conventional epoxy or optically transparent encapsulant is used to fill cavity area 24, surrounding semiconductor die 12 and bond wires 18. This epoxy may then be cured and made level with the top surface of package 10.

The above-described method for creating packages such as package 10 in quantity may be the most efficient method for creating such packages in a mass production environment. However, package 10 may also be individually molded, particularly for small production runs or for testing. The process for individually molding package 10 will now be described.

Referring to FIG. 5, lead frame 40 or a portion thereof is formed as previously described. Package mold 22 is then formed by injection molding around lead frame 40. In this embodiment, package mold 22 is formed for only one package in this molding process. Package mold 22 may therefore be formed in the desired shape, with chamfered corners 22a as previously described.

After the formation of package mold 22, semiconductor die 12 is attached to die pad 14 and wire bonds 18 are attached within cavity area 24 using conventional die attach and wire bond procedures. Any additional lead frame material outside package 10 may then be removed by a sawing process as previously described, if needed.

Lid 30 is placed inside upper perimeter 28 as previously described. Alternatively, an epoxy filler may be used in place of lid 30 as previously described.

It will be appreciated that the above described packaging methods yield a molded cavity semiconductor package with leads and a die pad at least partially exposed on both their upper and lower surfaces. This cavity semiconductor package may be used in applications where contact between the package mold and the semiconductor die and/or bond wires is undesirable. The above-described design features of the cavity semiconductor package allow the leads and die pad to be securely held in place by the package mold.

Although the present invention and its advantages have been described in detail, it should be understood that various changes, substitutions, and alterations can be made therein without departing from the spirit and scope of the invention as defined by the appended claims.

We claim:

1. A semiconductor chip package comprising:
    a die pad having opposed top and bottom surfaces;
    a semiconductor die mounted to the top surface of the die pad and having at least one bond pad disposed thereon;
    a plurality of leads projecting inwardly toward semiconductor die, each of the leads being of a lead thickness and having a body which defines opposed top and bottom surfaces and an inner end, at least one of the leads having a tab which projects from the body such that no portion of the tab extends beyond the bottom surface of the body;
    a package mold having a bottom surface and a cavity which is partially defined by an upper surface of a floor of the package mold, the floor having a floor thickness between the upper surface thereof and the bottom surface of the package mold which is substantially equal to the lead thickness;
    the package mold being formed such that portions of the top surfaces of the leads extending to the inner ends thereof are exposed within and substantially flush with the upper surface of the floor, the bottom surfaces of the leads are exposed within and substantially flush with the bottom surface of the package mold, and the tab is entirely encapsulated within the package mold.

2. The package of claim 1 further comprising a lid which is cooperatively engaged to the package mold in a manner enclosing the cavity.

3. The package of claim 1 wherein the inner end of each of the leads has a curved configuration.

4. The package of claim 1 further comprising a bond wire electrically connected to and extending between the bond pad of the semiconductor die and one of the leads, the bond wire being contained within the cavity of the package mold.

5. The package of claim 1 wherein the bottom surface of the die pad is exposed within and substantially flush with the bottom surface of the package mold.

6. The package of claim 1 wherein a plurality of the leads each include a tab which projects from the body thereof and is completely encapsulated by the package mold.

7. A semiconductor chip package comprising:
    a die pad having opposed top and bottom surfaces and being of a die pad thickness;
    a semiconductor die mounted to the top surface of the die pad and having at least one bond pad disposed thereon;
    a plurality of leads extending toward the die pad in substantially co-planar relation thereto, each of the leads being of a lead thickness which is substantially equal to the die pad thickness and having a body which defines opposed top and bottom surfaces and an inner end disposed in close proximity to the die pad;
    a package mold having a bottom surface and a cavity which is partially defined by an upper surface of a floor of the package mold, the floor having a floor thickness between the upper surface thereof and the bottom surface of the package mold which is substantially equal to the die pad and lead thicknesses;
    the package mold being formed such that the top surface of the die pad and portions of the top surfaces of the leads extending to the inner ends thereof are exposed within and substantially flush with the upper surface of the floor, and the bottom surfaces of the die pad and the leads are exposed within and substantially flush with the bottom surface of the package mold; and
    at least one conductor electrically connected to and extending between the bond pad of the semiconductor die and one of the leads, the conductor being contained within the cavity of the package mold.

8. The package of claim 7 further comprising a lid cooperatively engaged to the package mold in a manner enclosing the cavity.

9. The package of claim 7 wherein the inner end of at least some of the leads has a curved configuration.

10. The package of claim 7 wherein a plurality of the leads each include a tab which projects from the body thereof and is completely encapsulated by the package mold.

11. A semiconductor chip package comprising:

a die pad;

a semiconductor die mounted to the die pad;

a plurality of leads electrically connected to the semiconductor die, each of the leads being of a lead thickness, having a body which defines opposed top and bottom surfaces, and including a tab which extends outwardly from the body; and a package mold having a bottom surface and a cavity which is partially defined by an upper surface of a floor of the package mold, the floor having a floor thickness between the upper surface thereof and the bottom surface of the package mold which is substantially equal to the lead thickness;

the package mold being formed such that portions of the top surfaces of the leads extending to the inner ends thereof are exposed within the cavity, the bottom surfaces of the leads are exposed within the bottom surface of the package mold, and each of the tabs is entirely encapsulated within the package mold.

12. The package of claim 11 further comprising a lid which is cooperatively engaged to the package mold in a manner enclosing the cavity.

13. The package of claim 11 wherein the inner end of each of the leads has a curved configuration.

14. The package of claim 11 further comprising a bond wire electrically connected to and extending between the semiconductor die and one of the leads, the bond wire being contained within the cavity.

15. The package of claim 11 wherein the bottom surface of the die pad is exposed within the bottom surface of the package mold.

16. The package of claim 11 wherein each of the tabs projects angularly from the body beyond the top surface thereof.

17. A semiconductor chip package comprising:

a die pad having opposed top and bottom surfaces and being of a die pad thickness;

a semiconductor die mounted to the top surface of the die pad;

a plurality of leads extending toward the die pad in substantially co-planar relation thereto, each of the leads being of a lead thickness and having a body defining opposed top and bottom surfaces and a curved inner end disposed in close proximity to the die pad, and including a tab extending outwardly from the body thereof;

a package mold having opposed top and bottom surfaces, a first cavity which is partially defined by an upper surface of a floor of the package mold, and a second cavity adjacent the first cavity, the floor having a floor thickness between the upper surface thereof and the bottom surface of the package mold which is substantially equal to the die pad and lead thicknesses, the package mold being formed such that the semiconductor die, the top surface of the die pad, and portions of the top surfaces of the leads extending to the inner ends thereof are exposed within the cavity, the bottom surfaces of the die pad and the leads are exposed within the bottom surface of the package mold, and the tabs of the leads are completely encapsulated by the package mold;

conductors electrically connected to and extending between the semiconductor die and respective ones of the leads, the conductors being contained within the first cavity; and a lid disposed within the second cavity and enclosing the first cavity.

18. The package of claim 17 wherein each of the tabs projects angularly from the body beyond the top surface thereof.

19. The package of claim 17 wherein the second cavity has a larger cross-sectional area than the first cavity.

20. The package of claim 17 wherein the second cavity defines an opening at the top surface of the package mold.

* * * * *